US008692610B2

United States Patent
Takahashi

(10) Patent No.: US 8,692,610 B2
(45) Date of Patent: Apr. 8, 2014

(54) REFERENCE VOLTAGE SUPPLY CIRCUIT

(71) Applicant: Panasonic Corporation, Osaka (JP)

(72) Inventor: Keita Takahashi, Toyama (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/951,138

(22) Filed: Jul. 25, 2013

(65) Prior Publication Data

US 2013/0307608 A1    Nov. 21, 2013

Related U.S. Application Data

(63) Continuation of application No. PCT/JP2013/000600, filed on Feb. 4, 2013.

(30) Foreign Application Priority Data

Feb. 24, 2012    (JP) ................. 2012-039076

(51) Int. Cl.
G05F 1/10 (2006.01)
G05F 3/24 (2006.01)
G05F 3/16 (2006.01)

(52) U.S. Cl.
CPC G05F 3/24 (2013.01); G05F 3/242 (2013.01); G05F 3/16 (2013.01)
USPC .............. 327/540; 327/538; 323/313

(58) Field of Classification Search
CPC ............ G05F 3/02; G05F 3/08; G05F 3/10; G05F 3/16; G05F 3/18; G05F 3/20; G05F 3/24; G05F 3/245; G05F 3/247
See application file for complete search history.

(56) References Cited

U.S. PATENT DOCUMENTS

| 5,041,893 | A | * | 8/1991 | Nagai et al. ................ 257/379 |
| 5,221,864 | A |   | 6/1993 | Galbi et al. |
| 6,653,694 | B1 | * | 11/2003 | Osanai ........................ 257/392 |
| 7,426,146 | B2 | * | 9/2008 | Aota et al. ............... 365/189.09 |
| 7,843,253 | B2 | * | 11/2010 | Aota et al. ..................... 327/538 |
| 8,421,435 | B2 | * | 4/2013 | Hirose et al. ................. 323/315 |
| 8,507,998 | B2 | * | 8/2013 | Yamaji et al. ................ 257/392 |

(Continued)

FOREIGN PATENT DOCUMENTS

| JP | 60-150115 A | 8/1985 |
| JP | 62-099817 A | 5/1987 |

(Continued)

OTHER PUBLICATIONS

International Search Report issued in PCT/JP2013/000600, dated Apr. 2, 2013.

*Primary Examiner* — Thomas J Hiltunen

(74) *Attorney, Agent, or Firm* — McDermott Will & Emery LLP

(57) ABSTRACT

A reference voltage generator includes a first transistor and a second transistor coupled in series between a current supply and ground. Gate insulating films of the first transistor and the second transistor are made of the same type of film with the same thickness. Impurities contained in gate electrodes of the first transistor and the second transistor have different conductivity types, or have the same conductivity type and different concentrations. The first transistor has a greater gate width than the second transistor. The first transistor and the second transistor operate in a subthreshold region when a reference voltage is output outside.

18 Claims, 6 Drawing Sheets

(56) References Cited

U.S. PATENT DOCUMENTS

| | | |
|---|---|---|
| 2001/0020844 A1 | 9/2001 | Andoh et al. |
| 2005/0218968 A1* | 10/2005 | Watanabe ................ 327/541 |
| 2008/0297229 A1* | 12/2008 | Ramamoorthy ........... 327/513 |
| 2008/0303588 A1* | 12/2008 | Aota et al. ................ 327/546 |
| 2009/0179692 A1* | 7/2009 | Hidaka .................... 327/537 |
| 2013/0207636 A1* | 8/2013 | Yoshino et al. ........... 323/313 |

FOREIGN PATENT DOCUMENTS

| | | |
|---|---|---|
| JP | 5-250050 A | 9/1993 |
| JP | 2001-284464 A | 10/2001 |
| JP | 2002-261273 A | 9/2002 |
| JP | 2008-066649 A | 3/2008 |
| JP | 2008-263195 A | 10/2008 |
| JP | 2010-176258 A | 8/2010 |

\* cited by examiner

REFERENCE VOLTAGE SUPPLY CIRCUIT

CROSS-REFERENCE TO RELATED APPLICATIONS

This is a continuation of International Application No. PCT/JP2013/000600 filed on Feb. 4, 2013, which claims priority to Japanese Patent Application No. 2012-039076 filed on Feb. 24, 2012. The entire disclosures of these applications are incorporated by reference herein.

BACKGROUND

The present disclosure relates to reference voltage supply circuits, and more particularly to reference voltage supply circuits utilizing a work function difference.

In recent years, with development in the mobile market and the low power consumption market, microcomputers capable of standby with low power consumption have been demanded. In most cases, only a reference voltage supply circuit operates in a standby mode of a microcomputer, and thus lower power consumption of the reference voltage supply circuit is demanded.

Reference voltage supply circuits are largely divided into three types, a bandgap reference type, a MOS-Vth difference type, and a work function difference type. Out of the types, the work function difference type has excellent characteristics of low power consumption, and low dependency on process variations of a reference voltage value. However, this type has the problem of high temperature dependency, and is therefore generally not utilized.

A conventional reference voltage supply circuit utilizing a work function difference will be described below with reference to the drawings. (See, for example, Japanese Patent Publication No. S60-150115.)

The configuration of a conventional reference voltage supply circuit utilizing a work function difference will be described with reference to FIG. 9. As shown in FIG. 9, the conventional reference voltage supply circuit includes a p-channel metal oxide semiconductor (PMOS) transistor having a source to which a power supply voltage Vdd is applied, an NG_NMOS coupled in series to the PMOS, and a PG_NMOS coupled in series to the NG_NMOS.

The NG_NOMOS is a conventional n-channel metal oxide semiconductor (NMOS) transistor having an $n^+$-type gate electrode doped with phosphorus (P), and a threshold voltage of about 0.6 V. Different from a conventional NMOS, the PG_NMOS has a $p^+$-type gate electrode doped with boron (B). The $p^+$-type gate electrode has a higher work function than the $n^+$-type gate electrode by about 1.0 V. As a result, the PG_NMOS has a threshold voltage of about 1.6 V.

The PMOS functions as a constant current supply, and has a gate to which $Vg\_p1$ is input. The PMOS may be a resistor. The gates of the NG_NMOS and the PG_NMOS are directly coupled to the drain of the PMOS. The potential of the gates is defined as $Vg\_n1$. Furthermore, the NG_NMOS is located in a shallow p-type well of a deep n-type well. Since the p-type well is coupled to the source of the NG_NMOS, the potential of the p-type well is not fixed to Gnd, and eventually becomes a reference voltage Vref.

The NG_NMOS and the PG_NMOS have the same gate width W and the same gate length.

The three transistors of the circuit are coupled in series, and thus equal source/drain currents Ids constantly flow through the transistors.

In general, Ids in a saturated state of a MOS transistor is expressed by the following equation.

$$Ids=\beta/2\times(Vgs-Vth)^2$$

Where Ids of the NG_NMOS is Idsng, the threshold voltage is Vtng, the source voltage is Vsng, Ids of the PG_NMOS is Idspg, the threshold voltage is Vtpg, the source voltage is Vspg=0 V, and the work function difference between the $p^+$-type gate electrode and the $n^+$-type gate electrode is $\Phi pn$, the following equations are obtained.

$$Idsng=\beta/2\times(Vg\_n1-Vsng-Vtng)^2$$

$$Idspg=\beta/2\times(Vg\_n1-Vspg-Vtpg)^2=\beta/2\times(Vg\_n1-Vtng-\Phi pn)^2$$

From the equations and the equation Idsng=Idspg, $$Vg\_n1-Vsng-Vtng=Vg\_n1-Vtng-\Phi pn, \text{ and}$$

$$Vref=Vsng=\Phi pn$$

are obtained, and the source voltage Vsng of the NG_NMOS is equal to $\Phi pn$. That is, the work function difference $\Phi pn$ between the $p^+$-type gate electrode and the $n^+$-type gate electrode can be extracted using the source voltage Vsng of the NG_NMOS as a reference voltage Vref.

FIG. 10 illustrates the operating point of reference voltage generation. In FIG. 10, the horizontal axis represents the gate voltage $Vg\_n1$, and the vertical axis represents Log(Ids). The curves A-D respectively show the Ids characteristics of the NG_NMOS at a room temperature, the Ids characteristics of NG_NMOS at a temperature of 150° C., the Ids characteristics of the PG_NMOS at the room temperature, the Ids characteristics of the PG_NMOS at the temperature of 150° C. The intersections between a reference current flowing from the PMOS and the Ids characteristics determine the reference voltage Vref.

As described above, the following equations are obtained.

$$Idsng=\beta/2\times(Vg\_n1-Vsng-Vtng)^2$$

$$Idspg=\beta/2\times(Vg\_n1-Vtng-\Phi pn)^2$$

The terms indicate the temperature characteristics, and only the term $\Phi pn$ (=Vsng) is different. That is, only the temperature characteristics of $\Phi pn$ appears in Vsng, which is the reference voltage Vref. There is no influence of the temperature dependency of the reference current in the theoretical formulas.

FIG. 11 illustrates the temperature characteristics of the reference voltage Vref which are represented by measured values. As clear from the graph, the reference voltage Vref has negative temperature characteristics (i.e., about −0.6 mV/K), which are generally difficult to use as a reference voltage. In order to improve the temperature characteristics, various suggestions have been made (see, e.g., Japanese Patent Publication No. 2008-66649 and Japanese Patent Publication No. 2008-263195), but none of them are effective.

Japanese Patent Publication No. 2008-66649 teaches using an NG_NMOS transistor and a PG_NMOS transistor with different gate lengths to generate a reference voltage at a point at which Vt has low temperature dependency. However, the problem is that the point of the low temperature dependency shifts due to process variations.

Japanese Patent Publication No. 2008-263195 aims to cancel temperature characteristics using the work function difference (with positive temperature characteristics) between an $n^+$-type gate electrode and an $n^-$-type gate electrode (with low concentration impurities) and the work function difference (with negative temperature characteristics) between the $n^+$-type gate electrode and a $p^+$-type gate electrode. However, the problems is that the positive and negative temperature characteristics have different slopes, in particular, the work function difference between the n+-type gate electrode and the n−-type gate electrode have great process variations.

SUMMARY

In the above-described conventional art, the reference voltage is determined by utilizing the work function difference between the p+-type gate electrode and the n+-type gate electrode, and thus has the negative temperature characteristics (i.e., about −0.6 mV/K).

In view of the problem, the present disclosure was made to provide a reference voltage supply circuit with low temperature dependency and small variations in temperature characteristics.

In order to solve the problem, a reference voltage supply circuit according to a first aspect of the present disclosure includes a current supply, a first transistor, and a second transistor, which are sequentially coupled in series. The first transistor is provided in a first well, which is a shallow well located in a deep well of a first conductivity type provided in a semiconductor layer, and includes a first gate insulating film and a first gate electrode containing first gate impurities. The shallow well has a second conductivity type. The second transistor is provided in a second well of the second conductivity type provided in the semiconductor layer, and includes a second gate insulating film and a second gate electrode containing second gate impurities. The first gate electrode, a drain of the first transistor, and the second gate electrode are electrically coupled to the current supply. A source of the first transistor, a drain of the second transistor, and the first well are electrically coupled together. A source of the second transistor and the second well are coupled to ground. The first gate insulating film and the second gate insulating film are made of a same type of film with a same thickness. The first gate impurities contained in the first gate electrode and the second gate impurities contained in the second gate electrode have different conductivity types, or have a same conductivity type and different concentrations. The first transistor has a greater gate width than the second transistor. The first transistor and the second transistor operate in a subthreshold region when potential of the source of the first transistor is output outside as a reference voltage.

A reference voltage supply circuit according to a second aspect of the present disclosure includes a current supply, a first transistor, and a second transistor, which are sequentially coupled in series. The first transistor is provided in a first well, which is a shallow well located in a deep well of a first conductivity type provided in a semiconductor layer, and includes a first gate insulating film and a first gate electrode containing first gate impurities. The shallow well has a second conductivity type. The second transistor is provided in a second well of the second conductivity type provided in the semiconductor layer, and includes a second gate insulating film and a second gate electrode containing second gate impurities. The first gate electrode, a drain of the first transistor, and the second gate electrode are electrically coupled to the current supply. A source of the first transistor, a drain of the second transistor, and the first well are electrically coupled together. A source of the second transistor and the second well are coupled to ground. The first gate electrode has a higher work function than the second gate electrode. The first transistor has a greater gate width than the second transistor. The first transistor and the second transistor operate in a sub-threshold region when potential of the source of the first transistor is output outside as a reference voltage.

In the reference voltage supply circuit according to the first and second aspects of the present disclosure, a ratio of the gate width of the first transistor to the gate width of the second transistor preferably ranges from 5:1 to 1000:1.

In the reference voltage supply circuit according to the first and second aspects, the first transistor preferably includes M first transistor cells coupled in parallel, each having a first gate width and a first gate length. The second transistor preferably includes N second transistor cells coupled in parallel, each having the first gate width and the first gate length. M/N preferably ranges from 5 to 1000.

In the reference voltage supply circuit according to the first and second aspects, the first gate impurities preferably have n-type conductivity. The second gate impurities preferably have p-type conductivity.

In the reference voltage supply circuit according to the first and second aspects, the second gate impurities contained in the second gate electrode preferably have a higher concentration than the first gate impurities contained in the first gate electrode.

In the reference voltage supply circuit according to the first and second aspects, both of the first gate impurities contained in the first gate electrode and the second gate impurities contained in the second gate electrode preferably have n-type conductivity. The first gate impurities preferably have a higher concentration than the second gate impurities.

In the reference voltage supply circuit according to the first and second aspects, the reference voltage is preferably expressed by $Vref=\Phi pn+Log(m) \times swing$, where $Vref$ is the reference voltage, $\Phi pn$ is a work function difference between the first gate electrode and the second gate electrode, m is a ratio of the gate width of the first transistor to the gate width of the second transistor, and swing is sub-threshold swing of the first transistor and the second transistor.

In the reference voltage supply circuit according to the first and second aspects, a ratio of the gate width of the first transistor to the gate width of the second transistor preferably satisfies $\Delta Vref/\Delta T = \Delta\Phi pn/\Delta T + Log(m) \times \Delta swing/\Delta T$, where m is the ratio of the gate width of the first transistor to the gate width of the second transistor, $\Delta Vref/\Delta T$ represents temperature characteristics to be satisfied by the reference voltage, $\Delta\Phi pn/\Delta T$ represents temperature characteristics of a work function difference between the first gate electrode and the second gate electrode, and $\Delta swing/\Delta T$ represents temperature characteristics of sub-threshold swing of the first transistor and the second transistor.

In the reference voltage supply circuit according to the first and second aspects, a source/drain of each of the first transistor and the second transistor preferably includes a low-concentration impurity region and a high-concentration impurity region. The high-concentration impurity region preferably has an off-set structure not overlapping the first gate electrode or the second gate electrode.

The present disclosure provides a reference voltage supply circuit with low power consumption, low temperature dependency, and small variations in temperature characteristics, thereby reducing the standby power consumption of a microcomputer mounting the reference voltage supply circuit.

DETAILED DESCRIPTION

Embodiment

A reference voltage supply circuit according to an embodiment of the present disclosure will be described hereinafter with reference to the drawings.

Figure 1:
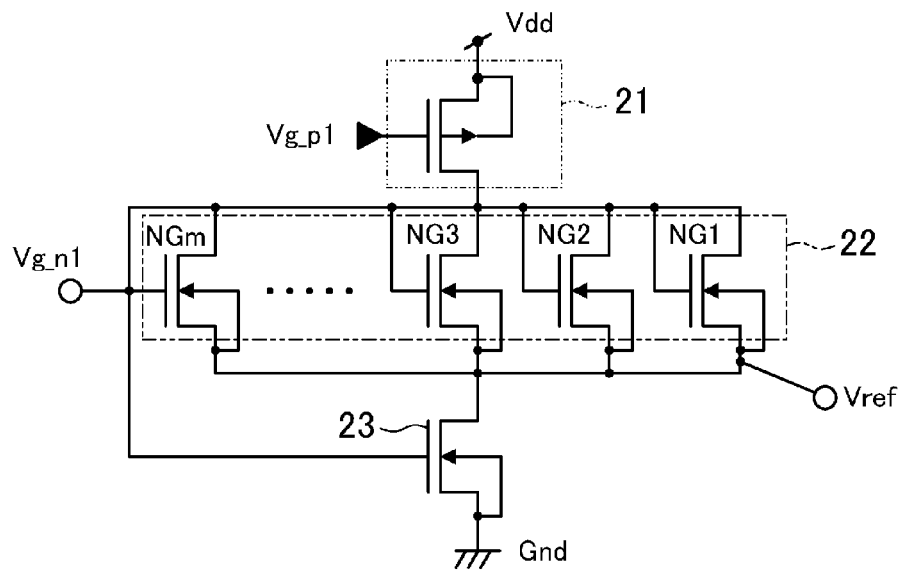
FIG. 1 is a diagram illustrating the configuration of a reference voltage supply circuit according to an embodiment.

The configuration of the reference voltage supply circuit according to this embodiment utilizing a work function difference will be described below with reference to FIG. 1. As shown in FIG. 1, the reference voltage supply circuit according to this embodiment includes a current supply 21, and a first transistor 22 and a second transistor 23, which are sequentially coupled in series between the current supply 21 and ground (Gnd). The potential of the source of the first transistor 22 is extracted outside the circuit as a reference voltage Vref. The current supply 21 is a p-channel metal oxide semiconductor (PMOS) transistor having a source to which a power supply voltage Vdd is applied, and a gate to which Vg_p1 is input. The current supply 21 may be a resistor etc. instead of the PMOS transistor. The first transistor 22 includes a plurality of n-channel metal oxide semiconductor (NMOS) transistors coupled in parallel, and is coupled in series to the PMOS transistor, which is the current supply 21. The second transistor 23 is an NMOS transistor coupled in series to the first transistor 22.

Figure 2:
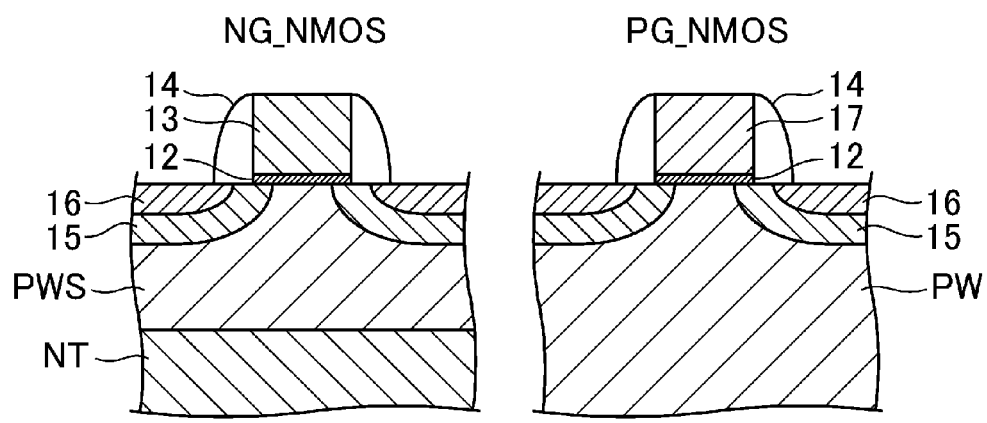
FIG. 2 is a cross-sectional view illustrating the structures of transistors forming the reference voltage supply circuit according to the embodiment.

As shown in the left of FIG. 2, the first transistor 22 is a conventional NMOS transistor, and is formed in a shallow p-type well PWS located in a deep n-type well NT of a semiconductor layer (i.e., a semiconductor substrate). The first transistor 22 includes a gate insulating film 12, an n$^+$-type gate electrode 13, which is generally doped with phosphorus (P), sidewalls 14, an LDD diffusion layer 15, and a source/drain diffusion layer 16. The first transistor 22 has a threshold voltage of about 0.60 V. The structure is hereinafter referred to as an NG_NMOS.

As shown in the right of FIG. 2, the second transistor 23 is formed in a p-type well PW, and includes a p$^+$-type gate electrode 17, which is generally doped with boron (B), different from a conventional NMOS. The structure is hereinafter referred to as a PG_NMOS. The p-type well of the second transistor 23 is not necessarily located in the deep n-type well, but may be located in the deep n-type well.

The gate electrode of the PG_NMOS has p$^+$-type conductivity, and thus has a higher work function than the n$^+$-type gate electrode 13 of the NG_NMOS by about 1.0 V. As a result, the PG_NMOS has a threshold voltage of about 1.6 V.

The relationship between a work function difference and a threshold voltage will be described below.

In general, the threshold voltage Vth of a MOS transistor is expressed by $$Vth = Vfb + 2 \times \Phi f + \{\sqrt{(2 \times \varepsilon s \times q \times Na \times (2 \times \Phi f + Vsb))}\}/Cox$$
$$= \Phi MS + \alpha + 2 \times \Phi f + \{\sqrt{(2 \times \varepsilon s \times q \times Na \times (2 \times \Phi f + Vsb))}\}/Cox,$$

where $\Phi MS$ is the work function difference.

The p$^+$-type gate electrode 17 has a lower work function than the n$^+$-type gate electrode 13 by about 1.0 V, and has thus, a higher threshold voltage by about 1.0 V, which is clear from the above equations. The other items (e.g., Na, Cox, etc.) of the NG_NMOS and the PG_NMOS are the same (have the same structure and are fabricated by the same process). The characteristic difference between the transistors is (DMS (i.e., the work function difference) only.

The first transistor 22 includes m first transistor cells NG1-NGm. Each of the cells NG1-NGm has the same gate width W and the same gate length as the PG_NMOS, which is the second transistor 23. That is, the first transistor 22 has a gate width which is m times the gate width of the second transistor 23.

In this embodiment, the first transistor 22 includes the m NG_NMOS transistors each of which has the same gate width W and the same gate length as the second transistor 23. However, having, as a whole, the gate width of m times the gate width of the second transistor 23 and the same gate length as the second transistor 23, the first transistor 22 may have any structure. For example, it may be simply a single NG_NMOS with a gate width W which is m times the gate width of the PG_NMOS, which is the second transistor 23. Where the first transistor 22 includes the m NG_NMOS transistors each of which has the same gate width W and the same gate length as the PG_NMOS, which is the second transistor 23, the characteristics identity between the first transistor 22 and the second transistor 23 improves, thereby increasing the accuracy of the reference voltage. The second transistor 23 is not necessarily a single transistor, and may include a plurality of PG_NMOS transistors. For example, the second transistor 23 may include N second transistor cells (PG_NMOS transistors) coupled in parallel, and the first transistor 22 may include M first transistor cells (NG_NMOS transistors) coupled in parallel. In this case, m is regarded as the number ratio (M/N) between the NG_NMOS transistors forming the first transistor 22 and the PG_NMOS transistor(s) forming the second transistor 23.

The gates of the first transistor 22 and the second transistor 23 are directly coupled to the source of the PMOS, which is the current supply 21. The potential of the gates is defined as Vg_n1. Furthermore, the NG_NMOS transistors, which form the first transistor 22, are located in the shallow p-type well PWS of the deep n-type well NT, and the shallow p-type well PWS is coupled to the sources of the NG_NMOS transistors, which form the first transistor 22. The potential of the PWS is not fixed to ground (Gnd) but is eventually the potential of the reference voltage Vref.

In this circuit, the PMOS, which is the current supply 21, the NG_NMOS transistors, which form the first transistor 22, and the PG_NMOS, which is the second transistor 23, are coupled in series. Thus, equal source/drain currents Ids constantly flow through these transistors. In the conventional art, Ids is calculated on the assumption that the transistors operate in a saturated current state, where Vgs>Vt and Vgd<Vt. In this embodiment, however, Ids is calculated on the assumption that the transistors operate in a subthreshold region, where Vg<Vt. The reasons are as follows.

In general, Ids of a MOS transistor in the subthreshold region, where Vg<Vt, is expressed by the following equation.

$$Ids = A \times 10^{(Vgs-Vth)/swing},$$

where A is a constant number, and swing is sub-threshold swing.

The sub-threshold swing is expressed by $$swing = LN(10) \times (k \times T/q) \times (1+Cd/Cox),$$

where k is a Boltzmann's constant (i.e., $1.38 \times 10^{-23}$ J/K),
T is an absolute temperature,
q is elementary charge (i.e., $1.6 \times 10^{-19}$ C),
Cd is the depression capacity of a channel, and
Cox is the capacity of a gate insulating film.

As seen from the equation, the sub-threshold swing has positive temperature characteristics.

At a room temperature, since $K \times T/q = 26$ mV, $$swing = 60 \times (1+Cd/Cox) \text{ [mV] is obtained.}$$

In general, $Cd/Cox \approx 0.4$, and eventually $$swing = 60 \times (1+Cd/Cox) = 60 \times 1.4 = 84 \text{ [mV] is obtained.}$$

At this time, assume that Ids of the first transistor 22 including NG_NMOS transistors is Idsng, the threshold voltage is Vtng, the source voltage is Vsng, Ids of the second transistor 23, which is the PG_NMOS, is Idspg, the threshold voltage is Vtpg, and the source voltage is Vspg=0V, and the work function difference between the p+-type gate electrode 17 and the n+-type gate electrode 13 is Φpn. Since the first transistor 22 has the gate width, which is m times the gate width of the second transistor 23, the following equations are obtained.

$$Idsng = m \times A \times 10^{(Vg\_n1-Vsng-Vtng)/swing}$$

$$Idspg = A \times 10^{(Vg\_n1-Vspg-Vtpg)/swing}$$

$$= A \times 10^{(Vg\_n1-Vtng-\Phi pn)/swing}$$

From the equations and Idsng=Idspg, $$(Vg\_n1-Vsng-Vtng)/swing+Log(m) = (Vg\_n1-Vtng-\Phi pn)/swing,$$

and $$Vref = Vsng = \Phi pn + Log(m) \times swing$$

are obtained. That is, the source voltage Vsng of the second transistor 23, which is the PG_NMOS, is used as the reference voltage Vref. As a result, the reference voltage Vref is extracted outside, which is the sum of the work function difference Φpn between the p+-type gate electrode 17 and the n+-type gate electrode 13, and the value of swing×Log (m), which is obtained by multiplying swing by Log of the number ratio m between the transistors forming the first transistor 22 and the second transistor 23.

Figure 3:
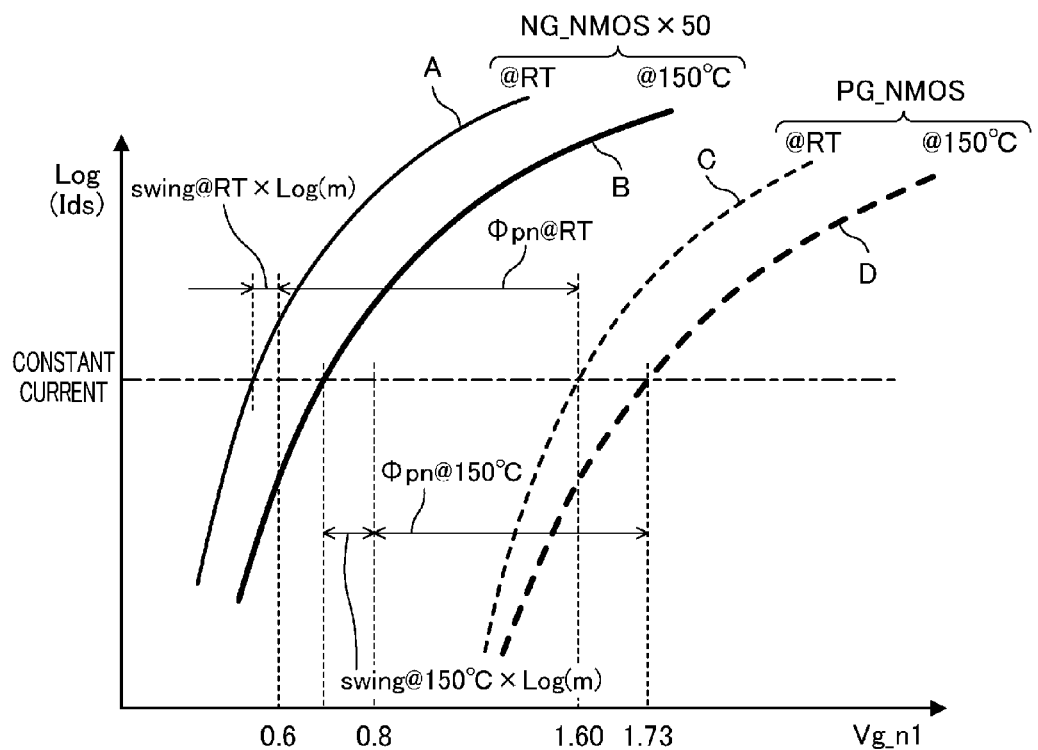
FIG. 3 illustrates the relationship between a gate voltage and a current value Log (Ids) for obtaining the operating point of reference voltage generation in the reference voltage supply circuit according to the embodiment.

FIG. 3 illustrates the operating point of the reference voltage. In FIG. 3, the horizontal axis represents a gate voltage Vg_n1, and the vertical axis represents Log (Ids). Curves A-D respectively show the Ids characteristics of the first transistor 22 including 50 NG_NMOS transistors at a room temperature, the Ids characteristics of the first transistor 22 at a temperature of 150° C., the Ids characteristics of the second transistor 23, which is the PG_NMOS, at the room temperature, and the Ids characteristics of the second transistor 23 at the temperature of 150° C. The intersections between a reference current flowing from the PMOS transistors and the Ids characteristics determine the reference voltage Vref.

As described above, a reference voltage at the room temperature Vref@RT, and a reference voltage at the temperature of 150° C. Vref@150° C. are respectively expressed by:

$$Vref@RT = \Phi pn@RT + Log(m) \times swing@RT,$$

and $$Vref@150° C. = \Phi pn@150° C. + Log(m) \times swing@150° C.$$

where swing@RT and swing@ 150° C. respectively represent the swing at the room temperature and the swing at the temperature of 150° C. As such, the reference voltage Vref is the sum of the work function difference Φpn between the p+-type gate electrode 17 and the n+-type gate electrode 13 having negative temperature characteristics (i.e., about −0.6 mV/K) and the swing having positive temperature characteristics. Thus, the temperature characteristics of Vref are reduced by adjusting the number ratio m between the transistors forming the first transistor 22 and the second transistor 23.

Figure 4:
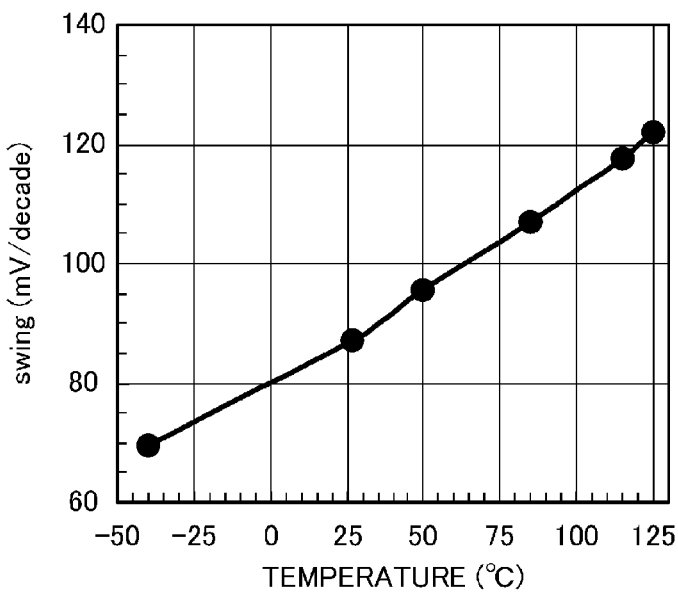
FIG. 4 illustrates temperature characteristics of sub-threshold swing in the reference voltage supply circuit according to the embodiment.
Figure 11:
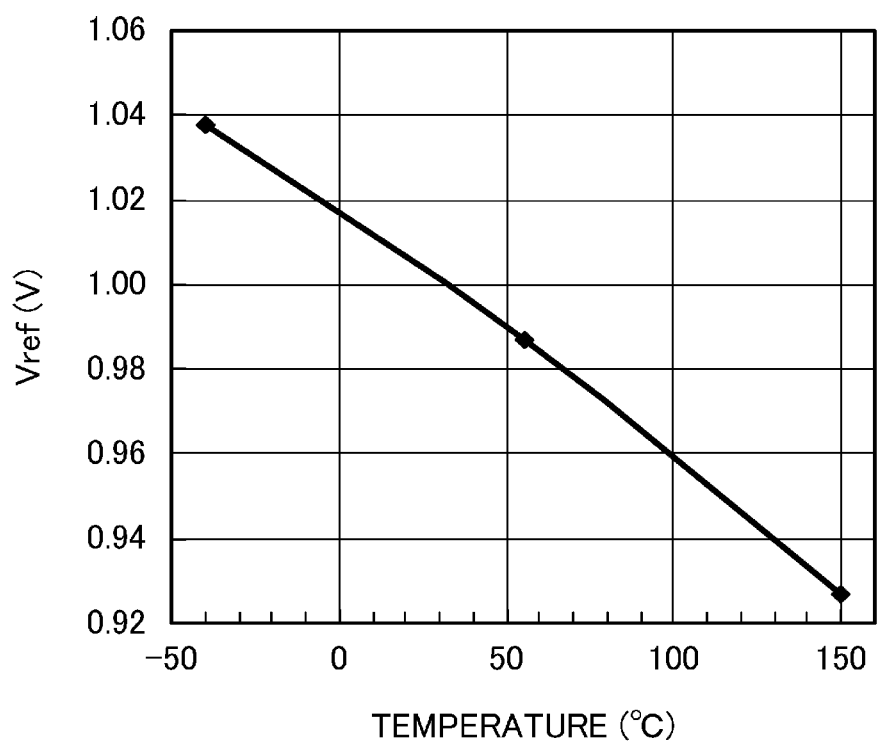
FIG. 11 illustrates an example of temperature characteristics of a reference voltage.

FIG. 4 illustrates the temperature characteristics of the sub-threshold swing, which are represented by measured values. As shown in the FIG. 4, the sub-threshold swing has positive temperature characteristics (i.e., about +0.32 mV/K), which are opposite to the characteristics of the work function (see FIG. 11) having the negative temperature characteristics.

From the equation of $$swing = LN(10) \times (k \times T/q) \times (1+Cd/Cox),$$

$$\Delta swing/\Delta T = LN(10) \times (k/q) \times (1+Cd/Cox) \text{ is obtained.}$$

Where Cd/Cox=0.4,
$\Delta swing/\Delta T = 0.28$ [mV/K] is obtained, which is roughly equal to the measured value of about +0.32 mV/K.

Figure 5:
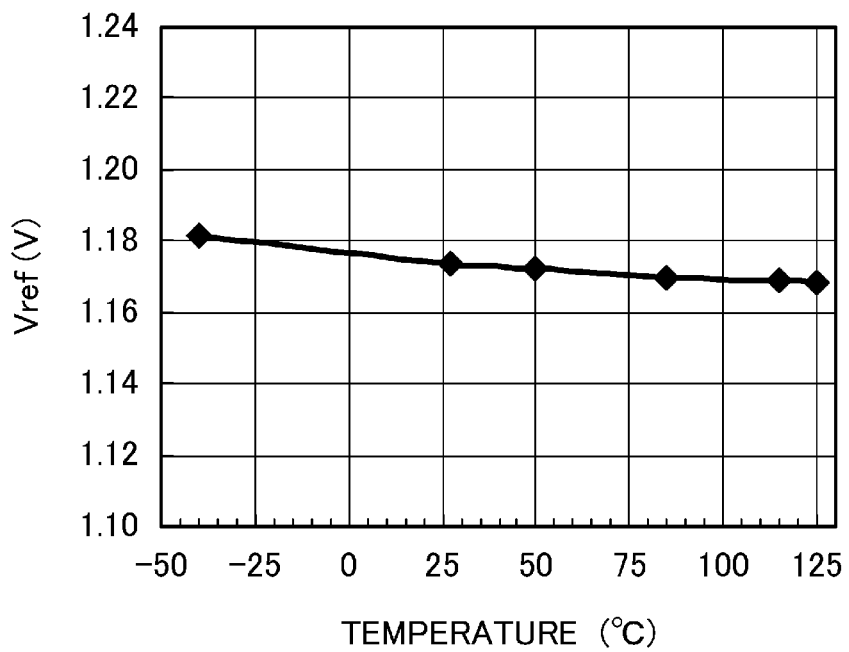
FIG. 5 illustrates temperature characteristics of a reference voltage in the reference voltage supply circuit according to the embodiment.

FIG. 5 illustrates the temperature characteristics of the reference voltage Vref, which are represented by measured values. An example will be described here where the number ratio m between the transistors forming the first transistor 22 and the second transistor 23 is 100, and Ids is 100 nA. As such, flat characteristics (−0.06 mV/K) with almost no temperature characteristics are obtained.

Figure 6:
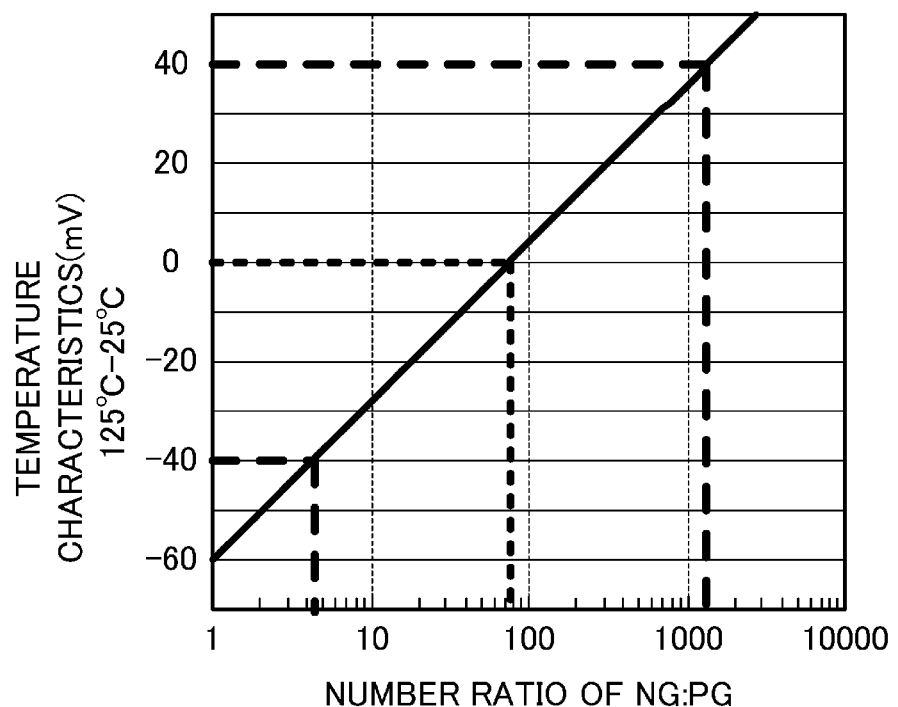
FIG. 6 illustrates the relationship between the temperature characteristics and the number ratio between NG_NMOS and PG_NMOS transistors in the reference voltage supply circuit according to the embodiment.

FIG. 6 illustrates a proper number ratio m. In FIG. 6, the horizontal axis represents the number ratio m between the transistors forming the first transistor 22 and the second transistor 23, and the vertical axis represents the difference between the reference voltage Vref@125° C. and the Vref@RT, where the room temperature ≈25° C. Where m=1, the temperature is about −60 mV based on the negative temperature characteristics (i.e., about −0.6 mV/K) of the work function difference. With an increase in the ratio m, the temperature characteristics become flat.

Specifically calculated,
from the equation $$Vref = Vsng = \Phi pn + Log(m) \times swing,$$

the temperature T dependency of the reference voltage Vref is expressed by $$\Delta Vref/\Delta T = \Delta \Phi pn/\Delta T + Log(m) \times \Delta swing/\Delta T.$$

Thus, the condition for completely losing the temperature characteristics (i.e., $\Delta V\text{ref}/\Delta T=0$) is expressed by the following equations.

$$\Delta\Phi pn/\Delta T = -\text{Log}(m) \times \Delta\text{swing}/\Delta T$$

$$m = 10^{-(\Delta\Phi pn/\Delta T)/(\Delta\text{swing}/\Delta T)}$$

Since $\Delta\Phi pn/\Delta T=-0.60$ mV/K and $\Delta\text{swing}/\Delta T=0.32$ mV/K from the measured value, m≈80 is obtained.

Since the reference voltage Vref≈1.17V @RT from FIG. 5, 1.17 V needs to be multiplied by about 1.5 and output to form a power supply of 1.8 V. In this case, the temperature characteristics increase by 1.5 times as well. Where the target specification is 1.80±0.135 V, (although it is usually 1.80±0.15 V, an error 0.015 V in trimming at the room temperature to determine the center value of Vref by a test at the room temperature is taken into consideration), $$0.135\ V \rightarrow 135\ mV/1.5 \approx 90\ mV$$

is the acceptable variations of the reference voltage Vref, which includes temperature characteristics. Furthermore, where 5% of variations of Vref @RT are accepted as process variations, $$1.17 \times 0.05 \approx 50\ mV\ \text{is obtained.}$$

Then, the fluctuation amount of reference voltage Vref accepted as the temperature characteristics is expressed by $$90\ mV - 50\ mV = 40\ mV.$$

The proper number ratio m between transistors forming the first transistor 22 and the second transistor 23 to meet this condition is 5-1000 as clear from FIG. 6. As such, in this embodiment, the proper ratio is determined by the ratio of the work function difference to the temperature characteristics of the sub-threshold swing. While, for simplicity of explanation, m is explained as the number ratio, m may be the ratio of the gate width of the first transistor 22 as a whole to the gate width of the second transistor 23 as a whole falls within this range.

As described above, since the temperature characteristics of the sub-threshold swing are utilized in this embodiment, the operating point of the circuit is in the subthreshold region.

Variation

Figure 7:
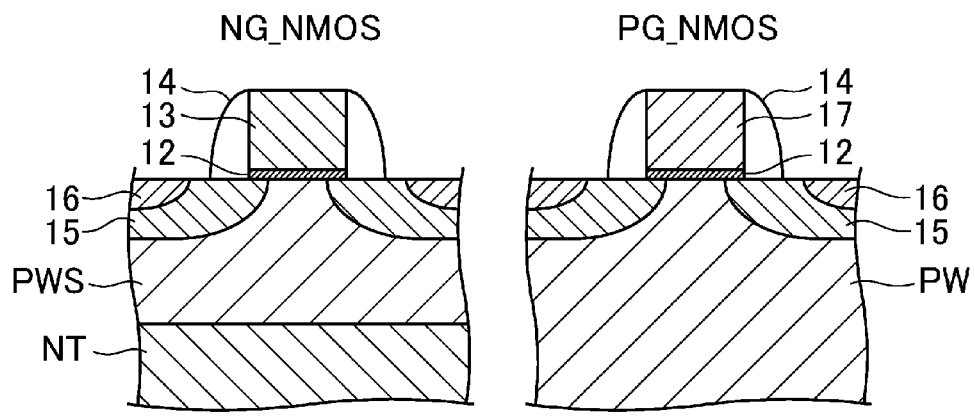
FIG. 7 is a cross-sectional view illustrating the structures of transistors forming a reference voltage supply circuit according to a variation.

A semiconductor memory device according to a variation of the embodiment will be described below with reference to the drawings. The structures of unique transistors used in this variation will be described with reference to FIG. 7. The left of FIG. 7 shows the structure of an NG_NMOS forming a first transistor 22. The right shows the structure of a PG_NMOS forming a second transistor 23. Although the transistors have almost the same structures as in FIG. 1, source/drain diffusion layers 16 are located apart from sidewalls 14 to form what is called an off-set structure.

A reference voltage Vref is expressed by the following equation.

$$V\text{ref}=V\text{sng}=\Phi pn+\text{Log}(m)\times\text{swing}$$

Thus, the process stability of swing is extremely important.

The sub-threshold swing is expressed by $$\text{swing}=LN(10)\times(k\times T/q)\times(1+Cd/Cox),$$

where K is a Boltzmann's constant,
T is an absolute temperature,
q is elementary charge,
Cd is the depression capacity of a channel, and
Cox is the capacity of a gate oxide film.
In particular, the stability of Cd (i.e., the depression capacity of the channel) is the key.

Therefore, as shown in FIG. 7, the source/drain diffusion layers 16 with a high concentration are spaced apart from a channel region (i.e., the lower region of the gate insulating film 12) as much as possible to reduce an influence on the stability of the impurity concentration of the channel and on the channel potential when a voltage is applied to the drain.

Therefore, with the configuration of this variation, a reference voltage supply circuit is provided, which has lower power consumption, lower temperature dependency, and smaller variations in temperature characteristics than that of the embodiment. As a result, the power consumption in a microcomputer mounting the reference voltage supply circuit is effectively reduced.

With the off-set structure, the drain voltage applied to the gate insulating film 12 decreases due to the extension of a depletion layer. This reduces degradation in reliability due to hot electrons, bias temperature (BT) stress, etc., thereby eventually reducing temporal change in the reference voltage Vref due to degradation in the reliability.

Figure 8:
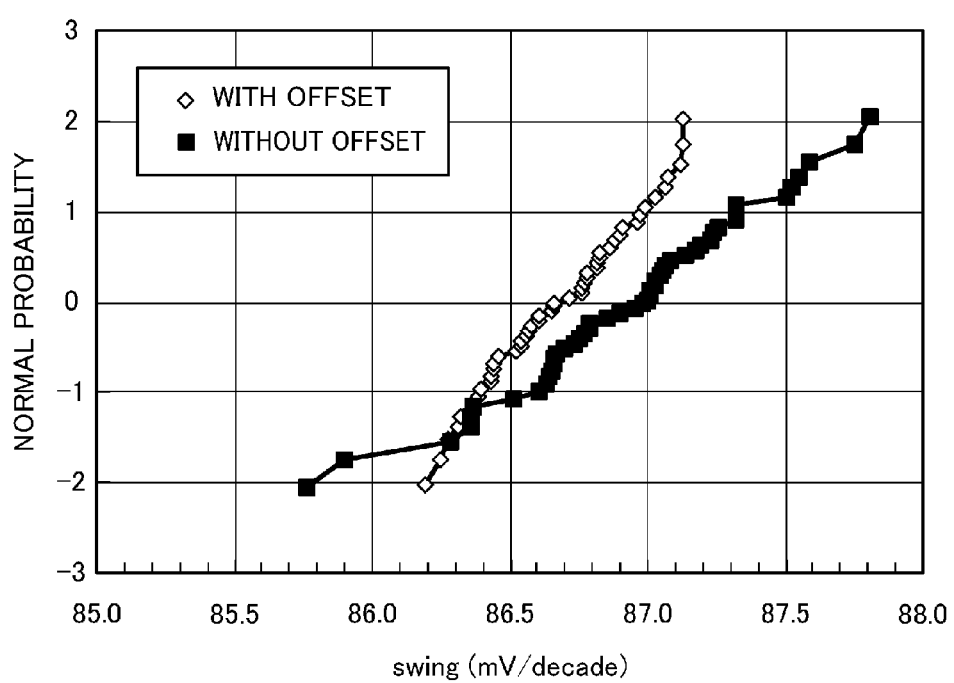
FIG. 8 illustrates the comparison of sub-threshold swing between an NG_NMOS transistor according to the variation and an NG_NMOS transistor including no off-set in a source/drain diffusion layer.
Figure 9:
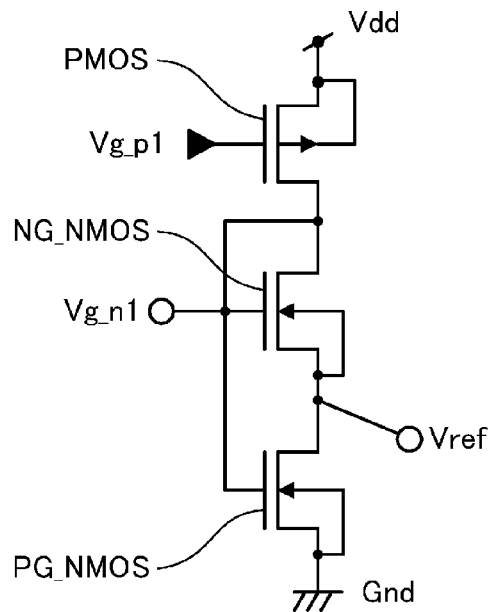
FIG. 9 is a diagram illustrating the configuration of a reference voltage supply circuit according to conventional art.
Figure 10:
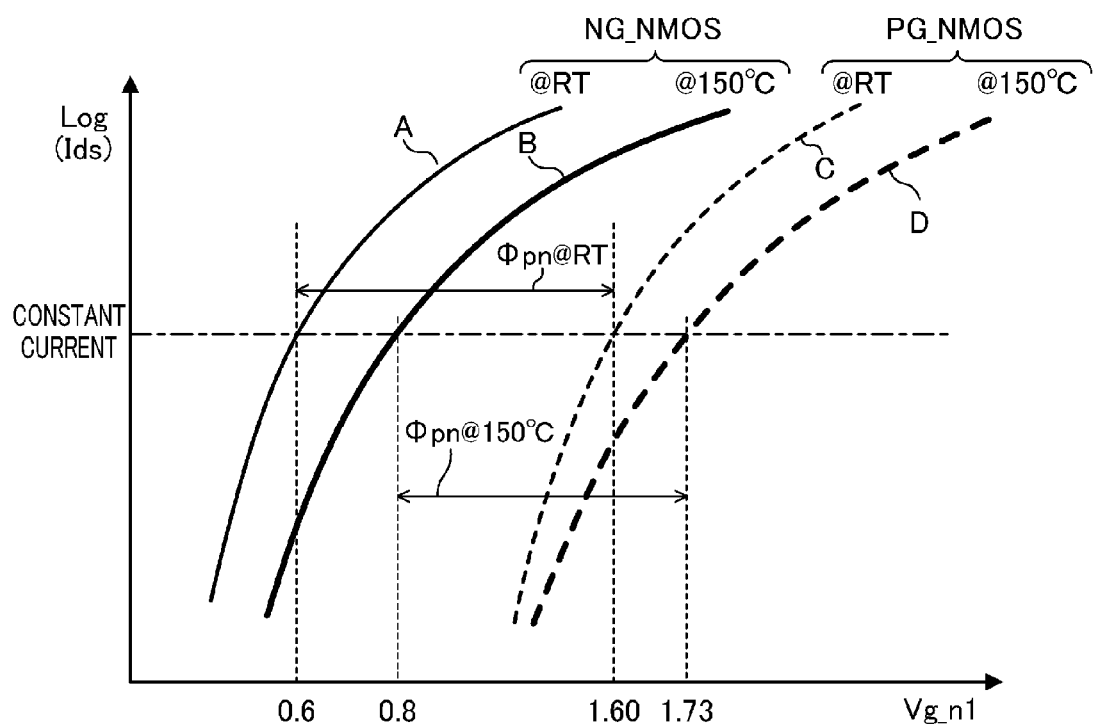
FIG. 10 illustrates an example of the relationship between a gate voltage and a current value Log (Ids) for obtaining the operating point of reference voltage generation.

FIG. 8 illustrates the comparison in sub-threshold swing between the NG_NMOS according to this variation with an off-set in the source/drain diffusion layer, and an NG_NMOS without any off-set in the source/drain diffusion layer.

The configuration shown in the embodiment has no problem in actual use. However, with the configuration of this variation, as shown in FIG. 8, variations in sub-threshold swing decrease more, thereby further stabilizing threshold characteristics.

In the embodiment and the variation, an example has been described where the first transistor 22 is the NMOS transistor having the $n^+$-type gate electrode, and the second transistor 23 is the NMOS transistor having $p^+$-type gate electrode. Instead, this may be a combination of an NMOS transistor having an $n^+$-type gate electrode and an NMOS transistor having an $n^-$-type gate electrode, a combination of an NMOS transistor having an $n^-$-type gate electrode and an NMOS having a $p^+$-type gate electrode, etc. However, in view of the stability of the work function difference, this is preferably a combination of an $n^+$ type and a $p^+$ type formed at an impurity concentration as high as possible.

The present disclosure provides a reference voltage supply circuit with low power consumption, low temperature dependency, and small variations in temperature characteristics. Therefore, the present disclosure is useful for reducing the temperature dependency of a reference voltage, and process variations in a reference voltage supply circuit.

What is claimed is:

1. A reference voltage supply circuit comprising:
a current supply; a first transistor; and a second transistor; which are sequentially coupled in series, wherein
the first transistor is provided in a first well, which is a shallow well located in a deep well of a first conductivity type provided in a semiconductor layer, and includes a first gate insulating film and a first gate electrode containing first gate impurities,
the shallow well has a second conductivity type,
the second transistor is provided in a second well of the second conductivity type provided in the semiconductor layer, and includes a second gate insulating film and a second gate electrode containing second gate impurities,
the first gate electrode, a drain of the first transistor, and the second gate electrode are electrically coupled to the current supply,
a source of the first transistor, a drain of the second transistor, and the first well are electrically coupled together,
a source of the second transistor and the second well are coupled to ground, the first gate insulating film and the second gate insulating film are made of a same type of film with a same thickness, the first gate impurities contained in the first gate electrode and the second gate impurities contained in the second gate electrode have different conductivity types, or have a same conductivity type and different concentrations, the first transistor has a greater gate width than the second transistor, and the first transistor and the second transistor operate in a subthreshold region when potential of the source of the first transistor is output outside as a reference voltage.

2. The reference voltage supply circuit of claim 1, wherein a ratio of the gate width of the first transistor to the gate width of the second transistor ranges from 5:1 to 1000:1.

3. The reference voltage supply circuit of claim 1, wherein the first transistor includes M first transistor cells coupled in parallel, each having a first gate width and a first gate length, the second transistor includes N second transistor cells coupled in parallel, each having the first gate width and the first gate length, and M/N ranges from 5 to 1000.

4. The reference voltage supply circuit of claim 1, wherein the first gate impurities have n-type conductivity, and the second gate impurities have p-type conductivity.

5. The reference voltage supply circuit of claim 4, wherein the second gate impurities contained in the second gate electrode have a higher concentration than the first gate impurities contained in the first gate electrode.

6. The reference voltage supply circuit of claim 1, wherein both of the first gate impurities and the second gate impurities have n-type conductivity, and the first gate impurities contained in the first gate electrode have a higher concentration than the second gate impurities contained in the second gate electrode.

7. The reference voltage supply circuit of claim 1, wherein the reference voltage is expressed by $$Vref = \Phi pn + \text{Log}(m) \times \text{swing},$$

where Vref is the reference voltage,

Φpn is a work function difference between the first gate electrode and the second gate electrode, m is a ratio of the gate width of the first transistor to the gate width of the second transistor, and swing is sub-threshold swing of the first transistor and the second transistor.

8. The reference voltage supply circuit of claim 1, wherein a ratio of the gate width of the first transistor to the gate width of the second transistor satisfies $$\Delta Vref/\Delta T = \Delta \Phi pn/\Delta T + \text{Log}(m) \times \Delta \text{swing}/\Delta T$$

where m is the ratio of the gate width of the first transistor to the gate width of the second transistor, ΔVref/ΔT represents temperature characteristics to be satisfied by the reference voltage, ΔΦpn/ΔT represents temperature characteristics of a work function difference between the first gate electrode and the second gate electrode, and Δswing/ΔT represents temperature characteristics of sub-threshold swing of the first transistor and the second transistor.

9. The reference voltage supply circuit of claim 1, wherein a source/drain of each of the first transistor and the second transistor includes a low-concentration impurity region and a high-concentration impurity region, and the high-concentration impurity region has an off-set structure not overlapping the first gate electrode or the second gate electrode.

10. A reference voltage supply circuit comprising:

a current supply; a first transistor; and a second transistor; which are sequentially coupled in series, wherein the first transistor is provided in a first well, which is a shallow well located in a deep well of a first conductivity type provided in a semiconductor layer, and includes a first gate insulating film and a first gate electrode containing first gate impurities, the shallow well has a second conductivity type, the second transistor is provided in a second well of the second conductivity type provided in the semiconductor layer, and includes a second gate insulating film and a second gate electrode containing second gate impurities, the first gate electrode, a drain of the first transistor, and the second gate electrode are electrically coupled to the current supply, a source of the first transistor, a drain of the second transistor, and the first well are electrically coupled together, a source of the second transistor and the second well are coupled to ground, the first gate electrode has a higher work function than the second gate electrode, the first transistor has a greater gate width than the second transistor, and the first transistor and the second transistor operate in a subthreshold region when potential of the source of the first transistor is output outside as a reference voltage.

11. The reference voltage supply circuit of claim 10, wherein a ratio of the gate width of the first transistor to the gate width of the second transistor ranges from 5:1 to 1000:1.

12. The reference voltage supply circuit of claim 10, wherein the first transistor includes M first transistor cells coupled in parallel, each having a first gate width and a first gate length, the second transistor includes N second transistor cells coupled in parallel, each having the first gate width and the first gate length, M/N ranges from 5 to 1000.

13. The reference voltage supply circuit of claim 10, wherein the first gate impurities have n-type conductivity, and the second gate impurities have p-type conductivity.

14. The reference voltage supply circuit of claim 13, wherein the second gate impurities contained in the second gate electrode have a higher concentration than the first gate impurities contained in the first gate electrode.

15. The reference voltage supply circuit of claim 10, wherein both of the first gate impurities and the second gate impurities have n-type conductivity, and the first gate impurities contained in the first gate electrode have a higher concentration than the second gate impurities contained in the second gate electrode.

16. The reference voltage supply circuit of claim 10, wherein the reference voltage is expressed by $$Vref = \Phi pn + \text{Log}(m) \times \text{swing},$$

where Vref is the reference voltage,

Φpn is a work function difference between the first gate electrode and the second gate electrode, m is a ratio of the gate width of the first transistor to the gate width of the second transistor, and swing is sub-threshold swing of the first transistor and the second transistor.

17. The reference voltage supply circuit of claim 10, wherein a ratio of the gate width of the first transistor to the gate width of the second transistor satisfies $$\Delta Vref/\Delta T = \Delta \Phi pn/\Delta T + \text{Log}(m) \times \Delta swing/\Delta T,$$

where m is the ratio of the gate width of the first transistor to the gate width of the second transistor, $\Delta Vref/\Delta T$ represents temperature characteristics to be satisfied by the reference voltage, $\Delta \Phi pn/\Delta T$ represents temperature characteristics of a work function difference between the first gate electrode and the second gate electrode, and $\Delta swing/\Delta T$ represents temperature characteristics of sub-threshold swing of the first transistor and the second transistor.

18. The reference voltage supply circuit of claim 10, wherein a source/drain of each of the first transistor and the second transistor includes a low-concentration impurity region and a high-concentration impurity region, and the high-concentration impurity region has an off-set structure not overlapping the first gate electrode or the second gate electrode.

* * * * *